United States Patent

Nunogami

[11] Patent Number: 5,136,191
[45] Date of Patent: Aug. 4, 1992

[54] OUTPUT BUFFER CIRCUIT FOR LSI CIRCUIT

[75] Inventor: Hiroyuki Nunogami, Itami, Japan

[73] Assignee: Mitsubishi Denki Kabushiki Kaisha, Tokyo, Japan

[21] Appl. No.: 734,949

[22] Filed: Jul. 24, 1991

[30] Foreign Application Priority Data

Sep. 11, 1990 [JP] Japan .................................. 2-241415

[51] Int. Cl.⁵ .................................................. H03K 19/00
[52] U.S. Cl. ...................................... 307/475; 307/451; 307/579; 307/443
[58] Field of Search ............... 307/443, 451, 475, 239, 307/571, 579, 585

[56] References Cited

U.S. PATENT DOCUMENTS

| | | | |
|---|---|---|---|
| 4,851,721 | 7/1989 | Okitaka | 307/451 |
| 4,888,500 | 12/1989 | Nicollini et al. | 307/475 |
| 5,003,205 | 3/1991 | Kohda . | |
| 5,023,488 | 6/1991 | Gunning | 307/475 |
| 5,045,730 | 9/1991 | Cooperman et al. | 307/451 |
| 5,073,726 | 12/1991 | Kato et al. | 307/451 |

FOREIGN PATENT DOCUMENTS

3936676A1 10/1990 Fed. Rep. of Germany .

*Primary Examiner*—Robert J. Pascal
*Attorney, Agent, or Firm*—Morrison Law Firm

[57] ABSTRACT

An output buffer circuit for an LSI circuit includes a control signal generating circuit, responsive to a signal at either one of first and second levels from an internal logic circuit for generating a control voltage at a level which is sufficient to reliably turn off the PMOSFET of a first CMOS circuit in the output buffer circuit. When the PMOSFET of the first CMOS circuit is turned off, a feedback circuit applies to the gate electrode of the PMOSFET, a signal at a level sufficient to maintain the PMOSFET in the non-conductive state regardless of changes in the control voltage while the signal from the internal logic circuit is at above-stated one level.

10 Claims, 5 Drawing Sheets

OUTPUT BUFFER CIRCUIT FOR LSI CIRCUIT

This invention relates to an LSI circuit and particularly to an output buffer circuit for a master-sliced LSI circuit, i.e. an LSI circuit prepared by a master slice approach.

BACKGROUND OF THE INVENTION

FIG. 1 shows an example of a master-sliced LSI circuit with a conventional output buffer circuit. The output of an internal logic circuit section 1 includes an output CMOS circuit 10 which comprises a P-channel MOSFET (hereinafter referred to as PMOSFET) 3 and an N-channel MOSFET (hereinafter referred to as NMOSFET) 4. The source electrode of the PMOSFET 3 is connected to a first voltage source 5 of, for example, $V_{DD1} = 3.3$ V, while the source electrode of the NMOSFET 4 is connected to a ground potential point GND. The gates of the transistors 3 and 4 are connected together to a node 7 which is connected to another internal logic circuit section (not shown). The drain electrodes of the transistors are connected together at a node 8. The node 8 is connected to a junction 13 of the gate electrodes of a PMOSFET 11 and an NMOSFET 12 which form a first CMOS circuit 14 of a buffer circuit 2.

The buffer circuit 2 includes, in addition to the above-stated first CMOS circuit 14, a second CMOS circuit 17 comprising a PMOSFET 15 and an NMOSFET 16. The source electrodes of the PMOSFET's 11 and 15 are connected to a second voltage source 22 of, for example, $V_{DD2} = 5.0$ V, while the source electrodes of the NMOSFET's 12 and 16 are connected to a ground potential point GND. The junction 18 of the drain electrodes of the PMOSFET 11 and the NMOSFET 12 of the first CMOS circuit 14 is connected to the junction 19 of the gate electrodes of the PMOSFET 15 and the NMOSFET 16 of the second CMOS circuit 17. The junction 20 of the drain electrodes of the PMOSFET 15 and the NMOSFET 16 of the second CMOS circuit 17 is connected to an external connection terminal 21.

Now, the operation of the circuit of FIG. 1 is described. When an input signal is applied to the master-sliced LSI circuit, an arithmetic operation is provided on the input signal in the internal logic circuit section 1 so that one of the PMOSFET 3 and the NMOSFET 4 of the output CMOS circuit 10 becomes conductive. Then, as an output representing the result of the arithmetic operation of the internal logic circuit section 1, a signal at $V_{DD1}$ of the first voltage source or at ground potential GND is applied from the node 8 to the first CMOS circuit 14 of the buffer circuit 2. The first CMOS circuit 14 of the buffer circuit 2 transmits the output signal from the output CMOS circuit 10 of the internal logic circuit section 1 to the second CMOS circuit 17 in the form of a signal at $V_{DD2}$ of the second voltage source or at ground potential GND. Both PMOSFET 15 and NMOSFET 16 of the second CMOS circuit 17 have a high transconductance, so that the second CMOS circuit 17 can provide at the terminal 21 a signal at $V_{DD2}$ or ground potential GND having sufficient power to drive an external load of the master-sliced LSI circuit.

In the above-described master-sliced LSI circuit, signal transfer can be made without troubles if the voltage level $V_{DD1}$ of the first voltage source and the voltage level $V_{DD2}$ of the second voltage source are substantially equal to each other or if the difference between the two voltage levels is less than the threshold voltage of the PMOSFET 11 of the first CMOS circuit 14.

Recently, however, in order to produce master-sliced LSI's of higher performance, patterns for fabricating transistors have become finer and finer, which makes it more difficult to provide transistors with a sufficient voltage withstanding characteristic against source voltages or with minimum leakage. On the other hand, in view of the system arrangement scheme, it is preferable to use a high source voltage $V_{DD2}$ for systems external to the LSI circuit as in the conventional arrangement. To this end, it has been proposed to use different voltages for internal circuits of the LSI and for a circuit interfacing the LSI and the external system. However, problems are encountered in such an arrangement. For instance, in the conventional system shown in FIG. 1, when the PMOSFET 3 of the output CMOS circuit 10 of the internal logic circuit section 1 is turned on so that the potential at the node 8 becomes $V_{DD1}$, the potential at the gate electrode of the PMOSFET 11 of the first CMOS circuit 14 of the buffer circuit 2 is $V_{DD1}$ and the potential at the source electrode is $V_{DD2}$. If the difference between $V_{DD1}$ and $V_{DD2}$ is larger than the threshold voltage of the PMOSFET 11, the PMOSFET 11 is not turned off, while the NMOSFET 12 is conductive. Since both of PMOSFET 11 and NMOSFET 12 become conductive, a signal of correct potential level cannot be transferred to the second CMOS circuit 17. Furthermore, a leakage current flows through the conductive PMOSFET 11 and NMOSFET 12, which causes increase in total power consumption of the LSI.

The present invention can overcome the above-discussed problems. According to the present invention, an output buffer circuit for a master-sliced LSI circuit is provided, to which a signal from an internal logic circuit section of the master-sliced LSI circuit can be transferred, and which can transfer the thus transferred signal to an external system with no error. In addition, the output buffer circuit is formed such that undesirable leakage current flows therein.

SUMMARY OF THE INVENTION

An output buffer circuit for an LSI circuit according to the present invention comprises a control circuit which includes a control signal generating circuit for generating a control voltage at a level sufficient to reliably turn off a PMOSFET in a first CMOS circuit of the output buffer circuit in response to a signal at one of first and second levels applied thereto from an internal logic circuit section. The output buffer circuit further comprises a feedback circuit for applying to the gate electrode of the PMOSFET of the first CMOS circuit a signal at a level sufficient to maintain the PMOSFET non-conductive regardless of any changes of the control voltage while the signal from the internal logic circuit section remains at one of said first and second levels after the PMOSFET of the first CMOS circuit has been turned off in response to the control signal.

According to the present invention, the control circuit generates a control signal which can reliably turn off the PMOSFET of the first CMOS circuit in response to a signal supplied from the internal logic circuit section of the LSI circuit, and after the PMOSFET is turned off the feedback circuit operates to apply a voltage sufficient to maintain the non-conduction state of the turned-off PMOSFET to the gate of this PMOS- FET. Thus, a reliable signal transmission can be achieved even if different supply voltages are used for the internal section of the LSI circuit and for the section for interfacing the LSI circuit internal section with an external system.

DETAILED DESCRIPTIONS OF PREFERRED EMBODIMENTS

Figure 1:
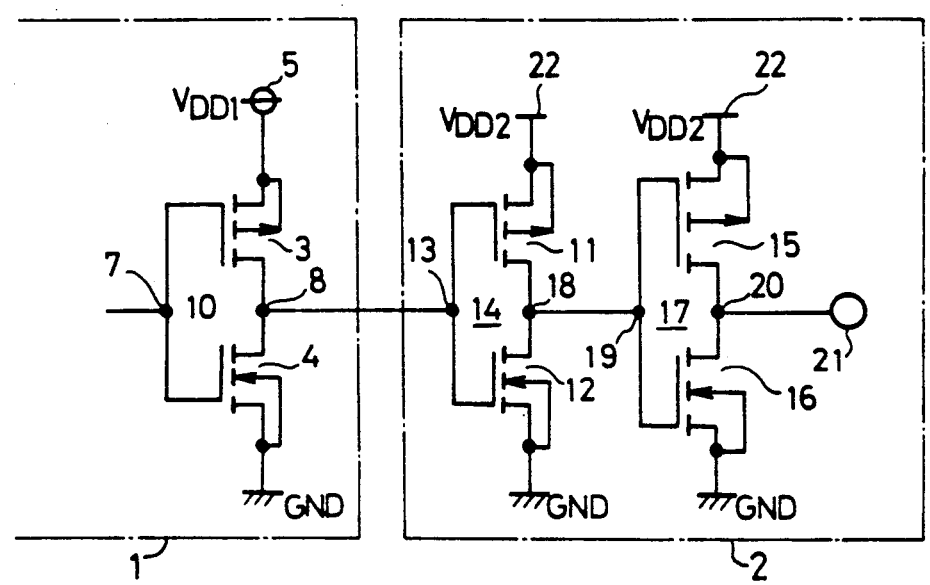
FIG. 1 is a circuit diagram of one example of conventional output buffer circuit for an LSI circuit.

First, the basic arrangement of an output buffer circuit for an LSI circuit according to the present invention is described with reference to the block diagram shown in FIG. 2.

An internal logic circuit section 1 provides an output signal at a $V_{DD1}$ level or ground (GND) level to an internal signal transmitting circuit 50 in a buffer circuit 2. The internal signal transmitting circuit 50 applies the signal from the internal logic circuit section 1 to a signal selection circuit 51 and also to a control signal generating circuit 52. The buffer circuit 2 includes an output stage driving circuit 54 which comprises a first CMOS circuit operating from a second supply voltage $V_{DD2}$. The second supply voltage $V_{DD2}$ is higher than the first supply voltage $V_{DD1}$. The buffer circuit 2 includes also an output stage 55 comprising a second CMOS circuit operating from the second supply voltage $V_{DD2}$. An output signal from the output stage 55 drives an external system via an external connection terminal 21.

The control signal generating circuit 52 responds to a signal at one of the $V_{DD1}$ and GND levels, for example, $V_{DD1}$ level, to generate a control signal at a level sufficient to place the output stage driving circuit 54 in a state corresponding to that one level ($V_{DD1}$) to which the control signal generating circuit 52 has responded. In this state, for example, a PMOSFET of the first CMOS circuit is turned on and an NMOSFET is turned off. This control signal is applied to the signal selection circuit 51. The signal selection circuit 51, the internal signal transmitting circuit 50, and the control signal generating circuit 52 form a control circuit 53 which controls the state of the output stage driving circuit 54.

When a signal applied from the internal logic circuit section 1 to the internal signal transmitting circuit 50 is at the above-stated one level, i.e. $V_{DD1}$, the signal selection circuit 51 applies the $V_{DD1}$ level signal and the control signal to the output stage driving circuit 54. This places the output stage driving circuit 54 and the output stage 55 in their respective states corresponding to the one level. A signal developed at the output of the output stage driving circuit 54 is applied to a feedback circuit 56. The feedback circuit 56 applies to the output stage driving circuit 54, directly or through the signal selection circuit 51, a signal at a level sufficient to maintain the output stage driving circuit 54 in its state corresponding to the one level.

When the signal applied from the internal logic circuit section 1 to the internal signal transmitting circuit 50 changes to the other level, i.e. GND level, the control signal is not coupled to the output stage driving circuit 54, and, the output stage driving circuit 54 changes to a state corresponding to the other level.

Now, the buffer circuit for an LSI circuit according to the present invention is described in detail with reference to FIGS. 3-5 which show some embodiments of the present invention.

Figure 3:
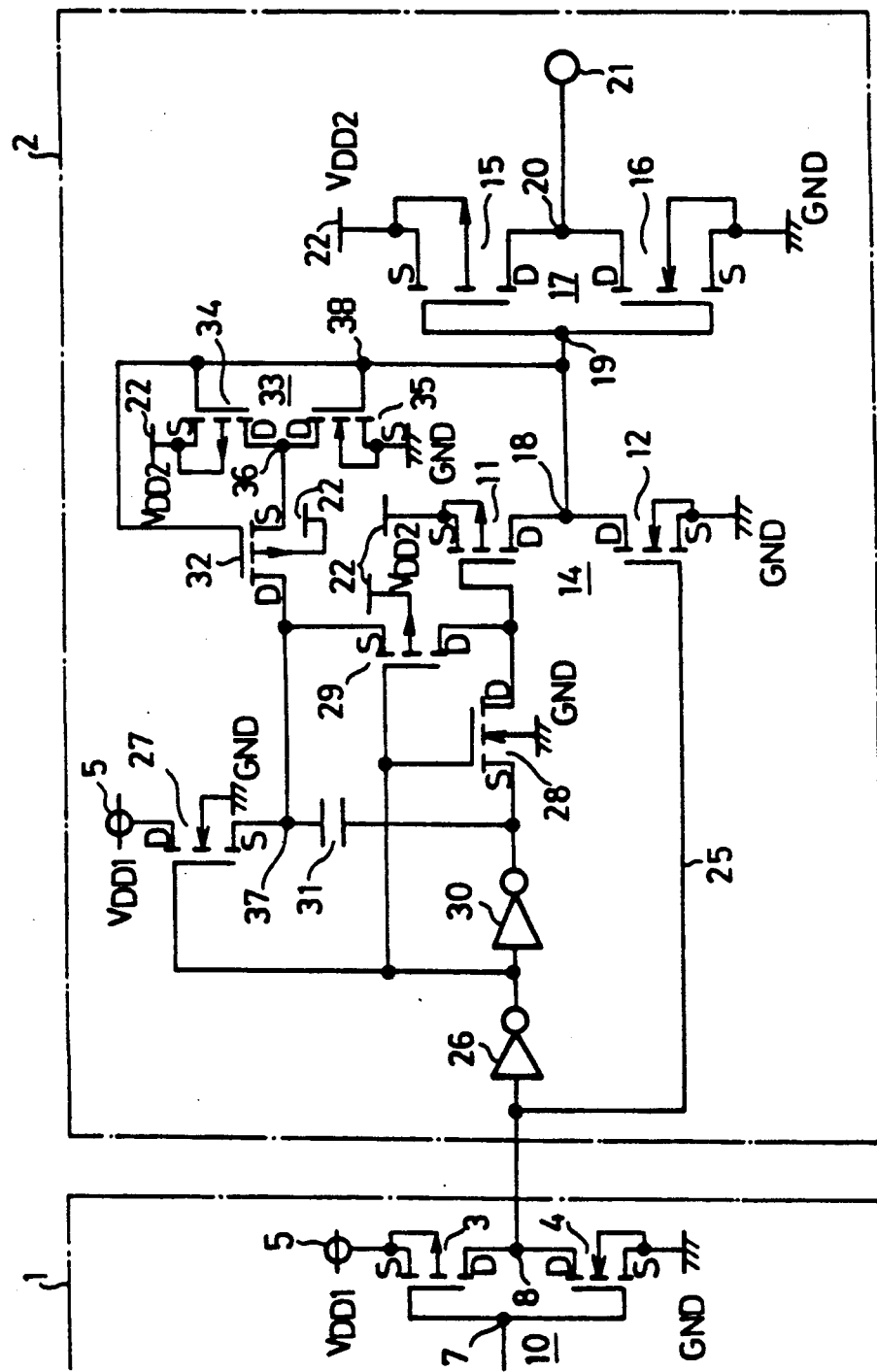
FIG. 3 is a circuit diagram of an output buffer circuit according to a first embodiment of the present invention.

FIG. 3 shows an output buffer circuit for an LSI circuit according to a first embodiment of the present invention. The same reference numerals and symbols as used in FIG. 1 denote similar components or functions. In FIG. 3, a node 8 to which the drain electrodes of FET's of an output CMOS circuit 10 of an internal logic circuit section 1 are connected in common is connected to a first inverter 26 of a buffer circuit 2 and also to the gate electrode of an NMOSFET 12 of a first CMOS circuit 14 through a line 25. The source electrode of the NMOSFET 12 is connected to a ground potential point (GND). The output of the first inverter 26 is connected to the respective gate electrodes of an NMOSFET 27, an NMOSFET 28, and a PMOSFET 29. Also, the output of the first inverter 26 is connected to a second inverter 30 of which the output is connected to the source electrode S of the NMOSFET 28. The drain electrode D of the NMOSFET 28 is connected together with the drain electrode D of the PMOSFET 29 and to the gate electrode of a PMOSFET 11 of the first CMOS circuit 14. The source electrode of the PMOSFET 11 is connected to a second voltage supply 22 which supplies a voltage of $V_{DD2}$.

A capacitor 31 is connected between the output of the inverter 30 and the source electrode S of the NMOSFET 27 of which the drain electrode D is connected to a first voltage supply 5 which supplies a voltage of $V_{DD1}$. A junction 37 of the source electrode S of the NMOSFET 27 and the capacitor 31 is connected to the source electrode S of the PMOSFET 29 and to the drain electrode D of a PMOSFET 32. The source electrode S of the PMOSFET 32 is connected to a junction 36 of the drain electrodes of a PMOSFET 34 and an NMOSFET 35 which form a CMOS circuit 33. The source electrode S of the PMOSFET 34 is connected to the second voltage supply 22 of $V_{DD2}$, while the source electrode S of the NMOSFET 35 is connected to the ground potential point GND. A node 38 to which the gate electrodes of the PMOSFET 34 and the NMOSFET 35 are connected is connected to a junction 18 at which the drain electrodes of the FET's of the first CMOS circuit 14 are connected together, and to a junction 19 at which the gate electrodes of the FET's of a second CMOS circuit 17 are connected together. The second CMOS circuit 17 is similar to that of a conventional circuit and comprises a PMOSFET 15 and an NMOSFET 16. A junction 20 of the drain electrodes is connected to an external connection terminal 21. The source electrode S of the PMOSFET 15 is connected to the second voltage supply 22 providing $V_{DD2}$. The source electrode S of an NMOSFET 16 is connected to the ground potential point GND. The substrate electrodes of the NMOSFET's 27 and 28 are connected to the ground potential point GND, and the substrate electrodes of the PMOSFET's 29 and 32 are connected to the second voltage supply 22 providing $V_{DD2}$. The substrate electrodes of the remaining PMOSFET's and NMOSFET's are connected to their respective source electrodes S.

Figure 2:
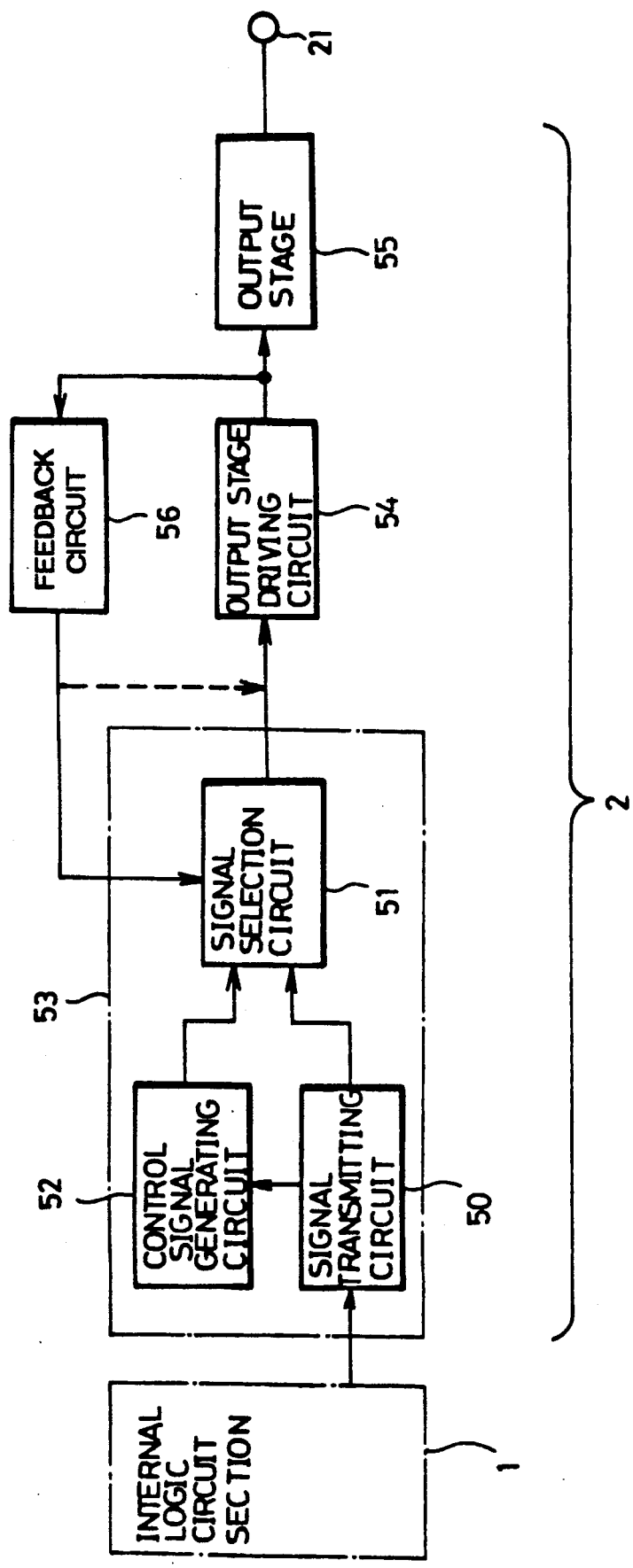
FIG. 2 is a block diagram of an output buffer circuit for an LSI circuit according to the present invention.

In the embodiment shown in FIG. 3, the line 25 and the first inverter 26 form the internal signal transmitting circuit 50 shown in FIG. 2. The NMOSFET 28 and the PMOSFET 29 form the signal selection circuit 51. The NMOSFET 27, the second inverter 30, and the capacitor 31 form the control signal generating circuit 52. The first CMOS circuit 14 forms the output stage driving circuit 54, and the second CMOS circuit 17 forms the output stage 55. The feedback circuit 56 is formed by the CMOS circuit 33 and the PMOSFET 32.

Next, the operation of the circuit shown in FIG. 3 is explained. The result of the arithmetic operation performed in the internal logic circuit section 1 appears in the form of a signal at the $V_{DD1}$ level or the GND level and is coupled to the node 7 at which the gate electrodes of the output CMOS circuit 10 are connected together.

(1) When Signal at $V_{DD1}$ Level Is Applied to Node 7

When a signal at the $V_{DD1}$ level appears at the node 7 at which the gate electrodes of the FET's of the output CMOS circuit 10 are connected together, a PMOSFET 3 and an NMOSFET 4 of the output CMOS circuit 10 become non-conductive and conductive, respectively. Thus, the node 8 is placed at the GND level, the output of the first inverter 26 is at the $V_{DD1}$ level, and the output of the second inverter 30 is at the GND level.

The NMOSFET 12 of the first CMOS circuit 14 forming the output stage driving circuit 54 is non-conductive, the NMOSFET's 27 and 28 are conductive, and the PMOSFET 29 is non-conductive. This causes the signal at the GND level to be coupled to the gate electrode of the PMOSFET 11 of the first CMOS circuit 14 through the conductive NMOSFET 28. Then, the PMOSFET 11 becomes conductive.

With the NMOSFET 12 and the PMOSFET 11 of the first CMOS circuit 14 being non-conductive and conductive, respectively, the junction 18 at which the drains of these FET's 11 and 12 are connected together assumes the $V_{DD2}$ level. This makes the PMOSFET 15 and the NMOSFET 16 of the second CMOS circuit 17, which forms the output stage, non-conductive and conductive respectively, whereby a signal at the GND level is transmitted to the external connection terminal 21.

Since the node 38 at which the gate electrodes of the FET's of the CMOS circuit 33 are connected together is at $V_{DD2}$, the PMOSFET 34 and the NMOSFET 35 are non-conductive and conductive, respectively and, therefore, the node 36 at which their drain electrodes are connected together assumes the GND level. At this time, the gate electrode of the PMOSFET 32 is at $V_{DD2}$, the source electrode S is at the GND level, and, therefore, the PMOSFET 32 is non-conductive.

The gate electrode of the NMOSFET 27 is at $V_{DD1}$ and, hence, at the same potential as its drain electrode. Accordingly, a potential which is equal to $V_{DD1}$ less the threshold voltage $V_{TN}$ of the NMOSFET 27, i.e. $V_{DD1} - V_{TN}$, appears at its source electrode S. Since the PMOSFET's 32 and 29 are both non-conductive at this time, as stated previously, and the potential at the output of the second inverter 30 is at the GND level, a charge corresponding to the potential $V_{DD1} - V_{TN}$ is stored on the capacitor 31.

(2) When GND Level Signal Is Applied to Node 7 Where Gate Electrodes of Output CMOS Circuit 10 Are Connected Together The PMOSFET 3 and NMOSFET 4 of the output CMOS circuit 10 are rendered conductive and non-conductive, respectively, so that the node 8 at which the drain electrodes of the FET's 3 and 4 are interconnected assumes the $V_{DD1}$ level. This causes the output of the first inverter 26 to assume the GND level and the output of the second inverter 30 to assume the $V_{DD1}$ level.

The NMOSFET 12 of the first CMOS circuit 14 is rendered conductive, the NMOSFET's 27 and 28 are both nonconductive, and the PMOSFET 29 is conductive. With both of the NMOSFET's 27 and 28 being non-conductive and the output of the second inverter 30 being at the $V_{DD1}$ level, a control signal at a level of $2V_{DD1} - V_{TN}$ is developed at junction 37 of the capacitor 31 and the source electrode S of the NMOSFET 27. This control signal is applied through the PMOSFET 29, which is conductive, to the gate electrode of the PMOSFET 11 of the first CMOS circuit 14.

Assuming that, as in the circuit of FIG. 1, $V_{DD1}$ is 3.3 V, $V_{DD2}$ is 5.0 V, and the threshold voltage $V_{TN}$ of the NMOSFET 27 is 0.8 V, the gate electrode of the PMOSFET 11 receives from the capacitor 31 through the PMOSFET 29 a control signal at a potential, $$2V_{DD1} - V_{TN} = 2 \times 3.3 - 0.8 = 5.8V$$

As stated above, since $V_{DD2}$ is 5.0 V, the potential, 5.8 V, applied to the gate electrode of the PMOSFET 11 is sufficient to completely turn off the PMOSFET 11.

When the PMOSFET 11 and NMOSFET 12 of the first CMOS circuit 14 are turned off and on, respectively, the junction 18 of the drain electrodes of these FET's is placed to the GND level, which results in the turning on and off of the PMOSFET 15 and NMOSFET 16 of the second CMOS circuit 17, respectively. Thus, a signal at the $V_{DD2}$ level has been transmitted to the external connection terminal 21.

The PMOSFET 34 and NMOSFET 35 of the CMOS circuit 33, which constitutes the feedback circuit 56, are conductive and non-conductive, respectively, so that the drain junction node 36 is placed at the $V_{DD2}$ level. At this instant, the gate electrode and source electrode S of the PMOSFET 32 are at the GND level and $V_{DD2}$ level, respectively, so that the PMOSFET 32 is turned on and the potential of $V_{DD2}$ appears at its drain electrode D. The $V_{DD2}$ potential is applied through the conductive PMOSFET 29 to the gate electrode of the PMOSFET 11 of the first CMOS circuit 14. Accordingly, even if the voltage across the capacitor 31 decreases due to leakage currents in transistors, the PMOSFET 11 can be maintained in the non-conductive state.

Thus, even if the first CMOS circuit 14 constituting the output stage driving circuit 54 and the second CMOS circuit 17 constituting the output stage 55, are operated from the second source voltage $V_{DD2}$ (of, for example, 5.0 V) which is sufficient to drive a load external to the LSI with the remaining circuits being operated from the lower first source voltage $V_{DD1}$ (of, for example, 3.3 V), the inversion of the states of the first and second CMOS circuits 14 and 17 is reliably achieved without fail.

Substantially similar operation is attained even if the gate of the NMOSFET 12 of the first CMOS circuit 14 is connected to the output of the second inverter 30.

Figure 6:
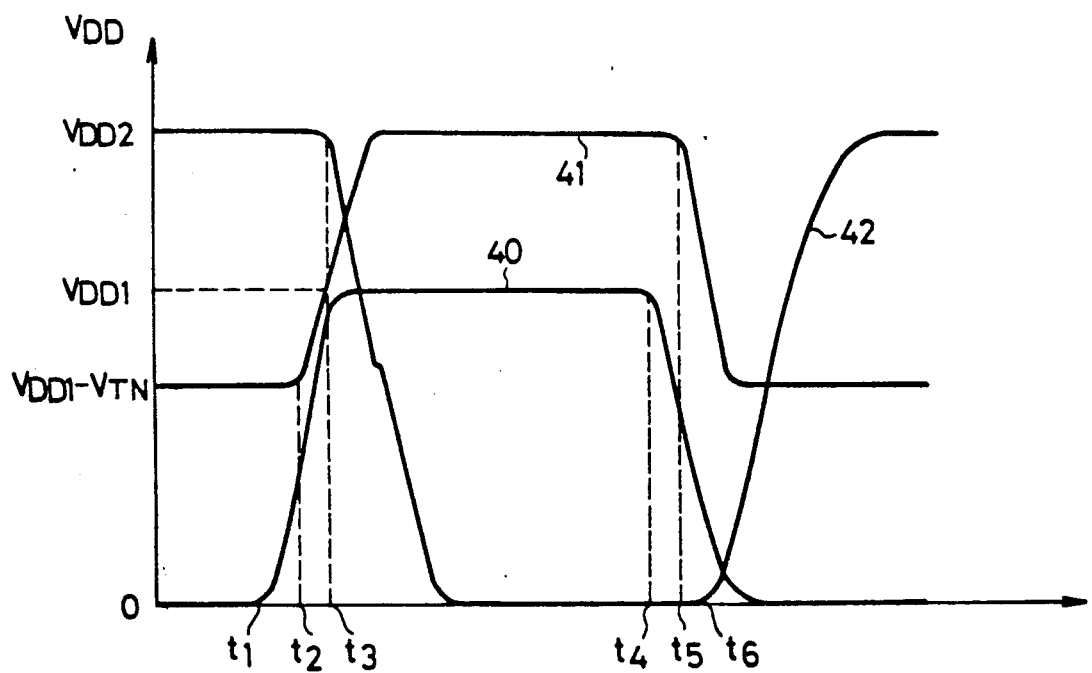
FIG. 6 shows waveforms showing level changes of signals at major portions of the output buffer circuit for an LSI circuit according to the present invention.

FIG. 6 shows signal level changes at various portions of the circuit of FIG. 3. In FIG. 6, a curve 40 shows potential (level) changes at the drain electrode junction node 8 of the output CMOS circuit 10 of the internal logic section 1. A curve 41 indicates potential level changes at the source electrode S of the NMOSFET 27, and a curve 42 indicates potential (level) changes at the drain electrode junction node 18 of the first CMOS circuit 14. As is seen from FIG. 6, potential level changes at the source electrode S of the NMOSFET 27 indicated by the curve 41 occur (at times $t_2$ and $t_5$) later than potential level changes at the drain electrode junction node 8 of the output CMOS circuit 10 (occurring at times $t_1$ and $t_4$) indicated by the curve 40, due to the presence of the first inverter 26. Potential level changes (occuring at times $t_3$ and $t_6$) at the drain electrode junction 18 of the first CMOS circuit 14 indicated by the curve 42 are delayed further due to the presence of the second inverter 30, the NMOSFET's 27 and 28 and the PMOSFET 29. Needless to say, these delay times must be chosen such as to give no adverse affect to the desired signal transmission rate in the output buffer circuit 2.

Figure 4:
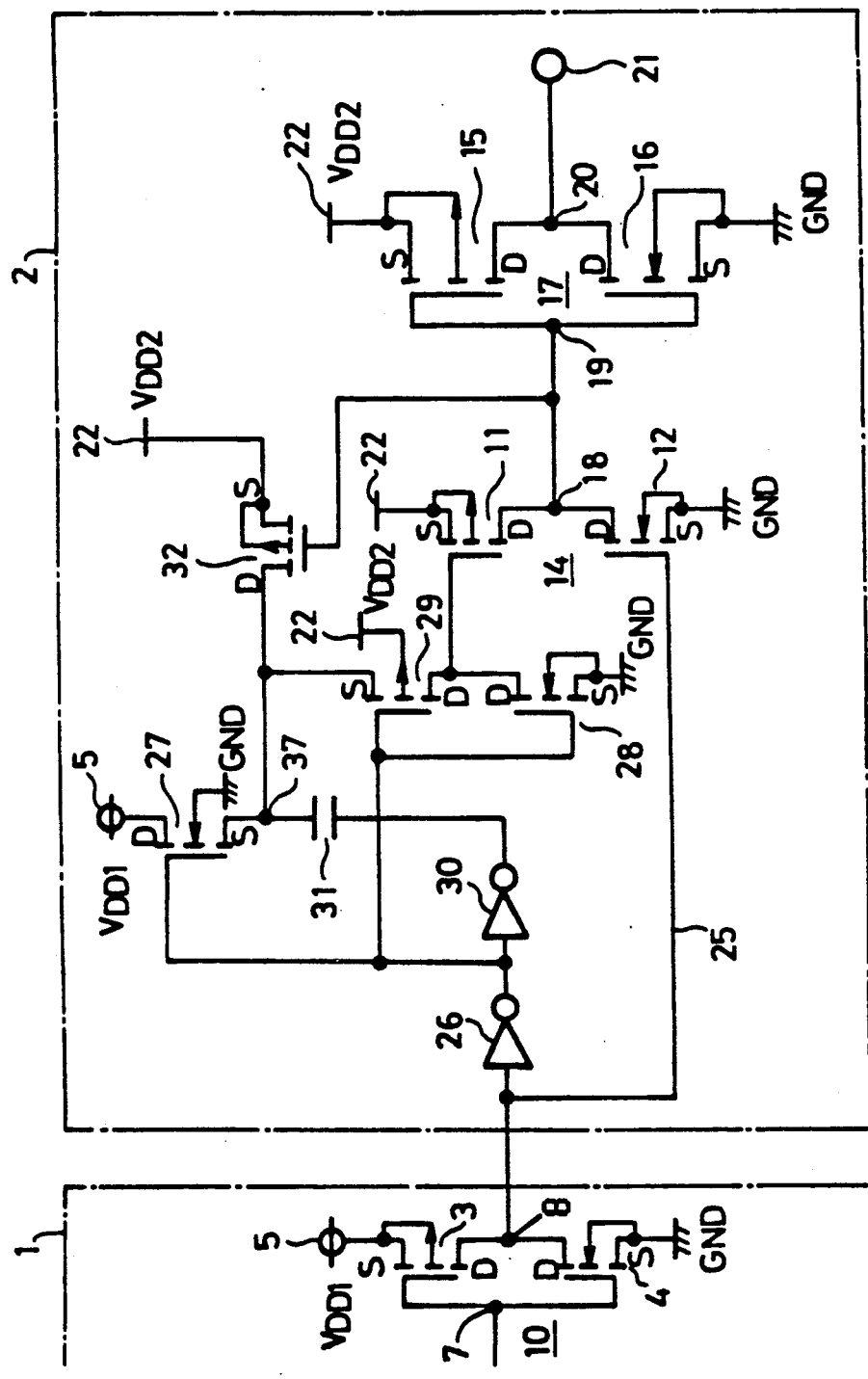
FIG. 4 is a circuit diagram of an output buffer circuit according to a second embodiment of the present invention.

FIG. 4 shows a second embodiment of the output buffer circuit according to the present invention. In this second embodiment, the source electrode of the NMOSFET 28 is coupled to GND rather than to the output of the second inverter 30. The source electrode S of the PMOSFET 32 is connected directly to the second voltage supply 22 of $V_{DD2}$. No circuit corresponding to the CMOS circuit 33 of the output buffer circuit 2 of FIG. 3 is used in the second embodiment.

Except that the feedback circuit 56 (FIG. 2) comprises the PMOSFET 32 only, the correspondence between the circuit of FIG. 4 and the circuit of FIG. 2 is the same as the one between the FIG. 3 circuit and the FIG. 2 circuit.

Next, the operation of the output buffer circuit of FIG. 4 is described.

(1) When Signal at $V_{DD1}$ Level Is Applied to Node 7

The node 8 at which the drain electrodes of the MOSFET's of the output CMOS circuit 10 are connected together assumes the GND level, so that the output of the first inverter 26 assumes the $V_{DD1}$ level and the output of the second inverter 30 assumes the GND level.

The NMOSFET 12 of the first CMOS circuit 14 is rendered non-conductive, the NMOSFET 28 conductive, and the PMOSFET 29 is rendered non-conductive. Thus, the GND level is applied to the gate electrode of the PMOSFET 11 of the first CMOS circuit 14 to turn on the PMOSFET 11.

The function 18 at which the drain electrodes of the MOSFET's 11 and 12 of the first CMOS circuit 14 are connected together assumes the $V_{DD2}$ level, whereas the function 20 at which the drain electrodes of the MOSFET's 15 and 16 of the second CMOS circuit 17 are connected together is at the GND level, so that the GND level signal is transmitted to the external connection terminal 21.

Since the function 18 is at the $V_{DD2}$ level, the PMOSFET 32 is non-conductive. Thus, the capacitor 31 is charged through the NMOSFET 27 to a potential which is equal to $V_{DD1} - V_{TN}$.

(2) When GND Level Signal Is Applied to Node 7

The node 8 in the output CMOS circuit 10 assumes the $V_{DD1}$ level, the output of the first inverter 26 assumes the GND level, and the output of the second inverter 30 assumes the $V_{DD1}$ level.

The NMOSFET 12 of the first CMOS circuit 14 is conductive, the NMOSFET's 27 and 28 are non-conductive, and the PMOSFET 29 is conductive. At the junction 37 where the capacitor 31 and the NMOSFET 27 are connected together, a control signal at the level equal to $2V_{DD1} - V_{TN}$ is developed. This control signal is applied to the gate electrode of the PMOSFET 11 of the first CMOS circuit 14 through the PMOSFET 29 which is conductive. This results in the full turn-off of the PMOSFET 11.

With the PMOSFET 11 non-conductive and the NMOSFET 12 conductive, the function 18 is placed to the GND level and the function 20 where the drain electrodes of the MOSFET's 15 and 16 of the second CMOS circuit 17 are coupled together assumes the $V_{DD2}$ level. Thus, the $V_{DD2}$ level signal is transmitted to the external connection terminal 21.

With the function 18 at the GND level, the PMOSFET 32 is rendered conductive so that the $V_{DD2}$ level is applied through the PMOSFET's 32 and 29 to the gate electrode of the PMOSFET 11 of the first CMOS circuit 14. Accordingly, if the potential across the capacitor 31 decreases due to current leakage, the PMOSFET 11 can be maintained fully non-conductive.

Thus, in the output buffer circuit 2 of FIG. 4, even when $V_{DD1}$ of, for example, 3.3 V and $V_{DD2}$ of, for example, 5.0 V are used, the inversion of the first CMOS circuit 14 which constitutes the output driving circuit and the inversion of the second CMOS circuit 17 constituting the output stage are reliably achieved.

The gate electrode of the NMOSFET 12 of the first CMOS circuit 14 of FIG. 4 may alternatively be connected to the output of the second inverter 30. Further, the source electrode of the NMOSFET 28 may be connected to the output of the second inverter 30 or the combination of the CMOS circuit 33 and the PMOSFET 32 shown in FIG. 3 may be substituted for the PMOSFET 32 of FIG. 4 with the gate electrode of the NMOSFET 28 being connected to the output of the first inverter 26 as illustrated.

Figure 5:
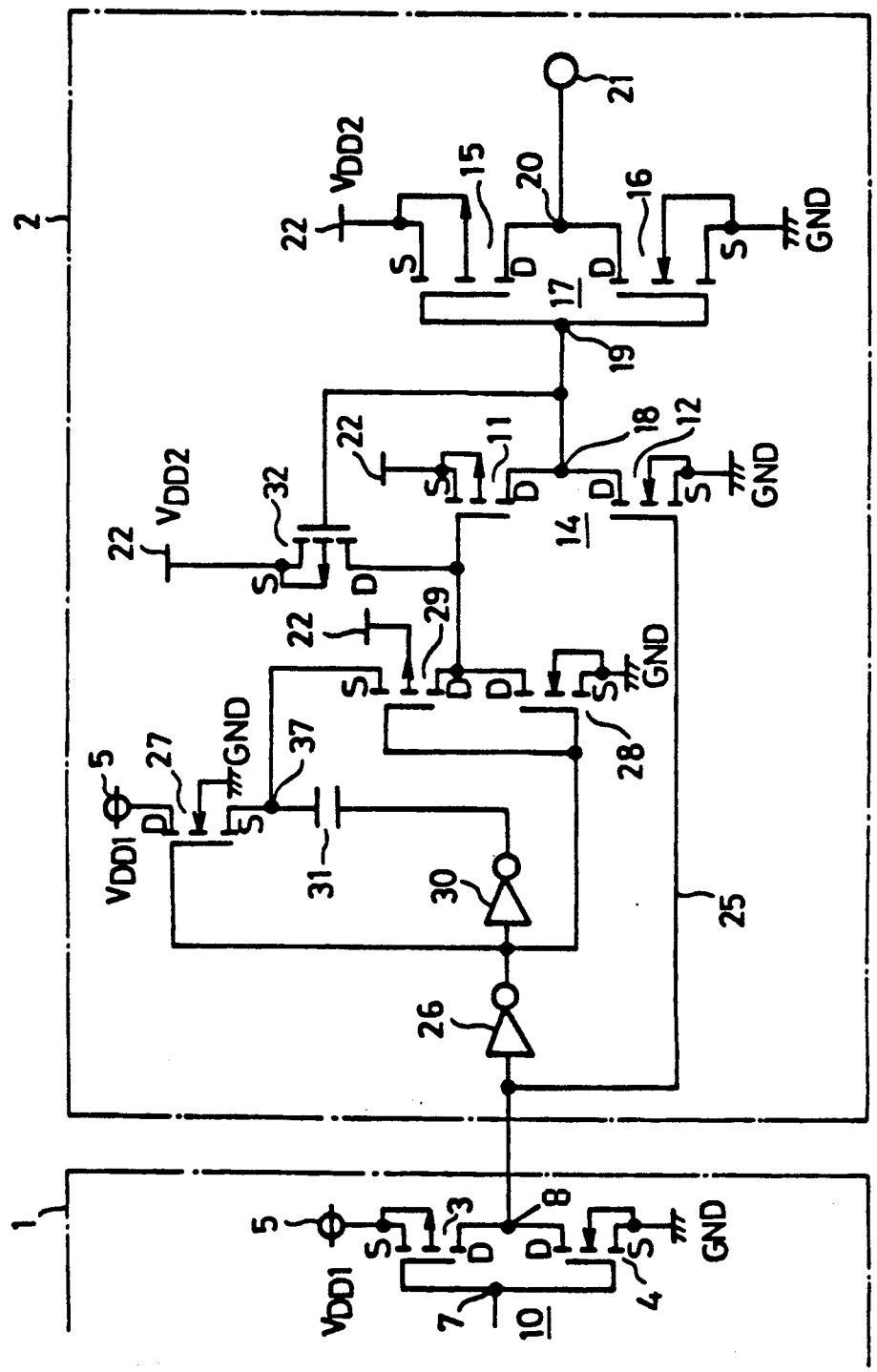
FIG. 5 is a circuit diagram of an output buffer circuit according to a third embodiment of the present invention.

FIG. 5 shows a third embodiment of the output buffer circuit according to the present invention, which is similar to the circuit shown in FIG. 4, except that the drain electrode D of the PMOSFET 32, which constitutes the feedback circuit, is connected, not to the source electrode of the PMOSFET 29, but directly to the gate electrode of the PMOSFET 11 of the first CMOS circuit 14 which constitutes the output stage driving circuit.

Although the connections among various circuit components differ from those of the FIG. 4 circuit, the correspondence of the respective components of the FIG. 5 circuit to the block diagram of FIG. 1 is the same as that of the FIG. 4 circuit.

The output buffer circuit of FIG. 5 operates in substantially the same manner as the circuit of FIG. 4. In the circuit of FIG. 5, the source electrode of the NMOSFET 28 of the signal selection circuit 51 (FIG. 2) may be connected to the output of the second inverter 30 as in the FIG. 3 circuit rather than to GND.

The correspondence of the block diagram of FIG. 2 illustrating the principle of the output buffer circuit of the present invention to the reference numerals in each of the embodiments illustrated in FIGS. 3, 4, and 5 is summarized below.

First Embodiment Shown in FIG. 3

| FIG. 2 | FIG. 3 |
| --- | --- |
| Internal Signal Transmitting Circuit 50 | 25, 26 |
| Signal Selection Circuit 51 | 28, 29 |
| Control Signal Generating Circuit 52 | 27, 30, 31 |
| Output Stage Driving Circuit 54 | 14 (11, 12) |
| Output Stage 55 | 17 (15, 16) |
| Feedback Circuit 56 | 33 (34, 35), 32 |

Second Embodiment Shown in FIG. 4

| FIG. 2 | FIG. 4 |
| --- | --- |
| Internal Signal Transmitting Circuit 50 | 25, 26 |
| Signal Selection Circuit 51 | 28, 29 |
| Control Signal Generating Circuit 52 | 27, 30, 31 |
| Output Stage Driving Circuit 54 | 14 (11, 12) |
| Output Stage 55 | 17 (15, 16) |
| Feedback Circuit 56 | 32 |

Third Embodiment Shown in FIG. 5

| FIG. 2 | FIG. 5 |
| --- | --- |
| Internal Signal Transmitting Circuit 50 | 25, 26 |
| Signal Selection Circuit 51 | 28, 29 |
| Control Signal Generating Circuit 52 | 27, 30, 31 |
| Output Stage Driving Circuit 54 | 14 (11, 12) |
| Output Stage 55 | 17 (15, 16) |
| Feedback Circuit 56 | 32 |

As described in detail above, the control signal generating circuit 52 of the third embodiment comprising the NMOSFET 27, the second inverter 30, and the capacitor 31. The control signal generating circuit 52 can render, without fail, the PMOSFET 11 of the first CMOS circuit 14 constituting the output stage driving circuit 54 non-conductive under a given signal condition. Once the PMOSFET 11 is turned off, the feedback signal supplied from the feedback circuit 56, which comprises the PMOSFET 32, or the combination of the PMOSFET 32 and the CMOS circuit 33, maintains the PMOSFET 11 non-conductive even if the level of the control signal changes. Accordingly, even if the LSI internal source voltage $V_{DD1}$ is, for example, 3.3 V or less and the source voltage $V_{DD2}$ for the circuit section interfacing external circuits such as the first CMOS circuit 14 constituting the output stage driving circuit 54 and the second CMOS circuit 17 constituting the output stage 55, is, for example, 5.0 V or higher, a signal can be correctly transmitted from the internal logic circuit section 1 to the external connection terminal 21.

What is claimed is:

1. An output buffer circuit for receiving an input binary signal having first and second voltage levels, and for producing an output binary signal having first and third voltage levels, wherein said third voltage level is substantially higher than said second voltage level, comprising:
    storage means, effective when said input binary signal is at one of said first and second voltage levels, for storing a stored voltage substantially equal to a difference between said first and second voltage levels ignoring forward voltage drops in saturated devices;
    means, effective when said input binary signal is at the other of said first and second voltage levels, for adding said difference to said stored voltage to produce an increased voltage substantially equal to twice said difference ignoring forward voltage drops in saturated devices;
    an output driving stage; and
    means for controlling said output driving stage with said increased voltage, whereby said output driving stage is fully controlled when said input binary signal is at the other of said first and second voltage levels.

2. Apparatus according to claim 1, further comprising:
    means for feeding back a signal substantially equal to said third voltage to said means for controlling, whereby said means for controlling is enabled to continue controlling, even if said storage means loses a substantial portion of said stored voltage.

3. Apparatus according to claim 1, wherein said storage means includes:
    a capacitor;
    means, effective during said one of said first and second voltage levels, for applying said difference between said first and second voltages across said capacitor; and
    means, effective during said other of said first and second voltage levels, for applying said one of said first and second voltage levels to one terminal of said capacitor, whereby said stored voltage is added to said one, and a second terminal of said capacitor exhibits said increased voltage.

4. Apparatus according to claim 1, wherein:
    said output driving stage includes a CMOS circuit having a PMOSFET in series with an NMOSFET; and
    said means for controlling includes means for applying said increased voltage to said PMOSFET, whereby said PMOSFET is turned completely off.

5. Apparatus according to claim 2, wherein said means for feeding back includes:
    at least one feedback transistor:
    said first and third voltage being connected at first and second terminals of said at least one feedback transistor; and
    an output of said output driving stage being connected to a control element of said at least one feedback transistor.

6. Apparatus according to claim 5, wherein:
    said at least one feedback transistor includes a CMOS circuit having an NMOSFET and a PMOSFET in series with each other;
    said output of said output driving stage being connected to gates of said NMOSFET and said PMOSFET;
    a series transistor;
    an output of said CMOS circuit being connected to said series transistor;
    a control element of said series transistor being connected to said output of said output driving stage; and
    means for connecting an output of said series transistor to a control element of said output driving stage, whereby control of said output driving stage is reinforced.

7. Apparatus according to claim 2 wherein said means for feeding back includes:
    at least one feedback transistor;
    a transistor for coupling said first voltage level (GND) to said at least one feedback transistor;
    a transistor for coupling said third voltage level ($V_{DD2}$) to said at least one feedback transistor; and an output of said output driving stage being connected to a control element of said at least one feedback transistor.

8. Apparatus according to claim 2 wherein said means for feeding back includes:

at least one feedback transistor;

said third voltage level ($V_{DD2}$) being coupled to said at least one feedback transistor; and an output of said output driving stage being connected to a control element of said at least one feedback transistor.

9. Apparatus according to claim 2 wherein said means for feeding back includes:

a CMOS circuit having an NMOSFET and a PMOSFET connected in series with each other; and another transistor;

an output of said output driving stage being connected to the gates of said NMOSFET and PMOSFET of said CMOS circuit and to the gate of said another transistor;

an output of said CMOS circuit being connected to a first terminal of said another transistor; and means being provided for connecting a second terminal of said another transistor to a control element of said output driving stage, whereby control of said output driving stage is reinforced.

10. Apparatus according to claim 2 wherein said means for feeding back includes:

a single transistor;

an output of said output driving stage being connected to the gate of said single transistor;

said third voltage level (VDD2) being coupled to a first terminal of said single transistor; and means being provided for connecting a second terminal of said single transistor to a control element of said output driving stage, whereby control of said output driving stage is reinforced.

* * * * *